United States Patent
Meding

(10) Patent No.: US 6,516,452 B2
(45) Date of Patent: Feb. 4, 2003

(54) METHOD AND APPARATUS FOR VERIFYING DESIGN DATA

(75) Inventor: Uwe Meding, Allen, TX (US)

(73) Assignee: Chipdata, Inc., Richardson, TX (US)

( * ) Notice: Subject to any disclaimer, the term of this patent is extended or adjusted under 35 U.S.C. 154(b) by 92 days.

(21) Appl. No.: 09/846,510

(22) Filed: May 1, 2001

(65) Prior Publication Data

US 2002/0166100 A1 Nov. 7, 2002

(51) Int. Cl.[7] .............................................. E06F 17/50
(52) U.S. Cl. ........................ 716/5; 716/21; 430/5; 430/30; 430/22
(58) Field of Search ................... 716/5, 21; 430/5, 430/30

(56) References Cited

U.S. PATENT DOCUMENTS

| | | | | |
|---|---|---|---|---|
| 4,902,899 A | * | 2/1990 | Lin et al. ........................ 430/5 |
| 5,631,110 A | * | 5/1997 | Shioiri et al. ................... 430/5 |
| 5,698,346 A | * | 12/1997 | Sugawara ....................... 430/5 |
| 5,705,301 A | * | 1/1998 | Garza et al. .................... 430/5 |
| 5,707,765 A | * | 1/1998 | Chen .............................. 430/5 |
| 5,723,233 A | * | 3/1998 | Garza et al. .................... 430/5 |
| 5,740,068 A | * | 4/1998 | Liebmann et al. ............. 716/21 |
| 6,015,644 A | * | 1/2000 | Cirelli et al. .................. 430/30 |
| 6,425,112 B1 | * | 7/2002 | Bula et al. ...................... 716/5 |

* cited by examiner

Primary Examiner—Michael Tokar
Assistant Examiner—Lam T Mai
(74) Attorney, Agent, or Firm—Carr Law Firm, L.L.P.

(57) ABSTRACT

Disclosed is an apparatus for comparing CAD (computer aided design) design data comprising one or more components with a set of design rules generated relative said components and generating an output report of detected discrepancies. The output may include data (annotations) used to generate a visually high-lighted (red-lined) display whereby the CAD generated design errors may be easily ascertained. The apparatus includes the capability of transmitting the CAD data, converted to a standardized XML format, from a remote CAD design site to a difference engine site having the latest set of rules relative said components. The difference engine site may then return the results to the remote CAD design site for use by the device design operator. The results returned may be visually displayed in red-lined format as well as in an itemized list.

22 Claims, 5 Drawing Sheets

METHOD AND APPARATUS FOR VERIFYING DESIGN DATA

TECHNICAL FIELD

The present invention relates in general to verifying that current design parameters pertaining to a given component, such as an electronic chip, have been complied with in a given CAD (computer aided design) device design.

BACKGROUND

The manufacturers of components, such as electronic data chips, have a set of rules and restrictions on the use of the chips, how the pins are connected or left unconnected, the value of components to be connected to the pins, and so forth. As a majority of circuit design problems concern the design of electronic chips, as opposed to many other components used in electronic circuit design, the word "chip" will be used primarily henceforth, although the present discussion applies to any components, groups of components or even relative physical placement of components included in electronic circuit design for which design rules may be generated. As "bugs" (design errors and so forth) in electronic chips are discovered and corrected, these rules and restrictions often change. The changes may be so buried in documentation that they may be hard to detect by a circuit designer. This is especially true where the circuit designer has used a given chip in previous circuit designs. Further, the latest data relative the design of a chip may have been misplaced, not ordered from the manufacturer or is otherwise unavailable to the circuit designer.

When the circuit is tested and found not to work, the design information, along with a sample of the circuit, is often physically sent to the manufacturer of the chip believed to be causing the problem with a request for help. An expert at circuit design debugging will then examine the circuit diagram and any supporting data in an attempt to ascertain if any pins on the chip were incorrectly connected.

As is known to circuit designers, many rules and stipulations are placed on appropriate circuit design relative a given manufacturers' chip. If these rules are not complied with, the manufacturer will not take any responsibility for failure or inoperability of the chip in the circuit. Examples of some of these conditions are set forth in the remainder of this paragraph. Some pins on a chip are for test purposes only and are never to be connected to anything. Other pins must be connected to ground or specific voltage levels (or be maintained within a given range of voltages) with respect to ground. It may be required that certain components, such as capacitors or resistors within a given range of values and even of specific composition, be connected to certain pins. Further, some pins must be connected together with path conductors having less than a given length and/or resistance for certain applications.

Even an expert may face a very time-consuming task in examining a detailed circuit diagram, making sure that the expert's knowledge of all chip design rules is current, and so forth.

In view of the above, it would thus be advantageous to automate the examination process of comparing any CAD design and, especially, an electronic circuit design with the latest set of rules applicable to an electronic chip used in a given circuit design. It would further be advantageous to be able to minimize the time necessary to provide the appropriate circuit design information to the manufacturer and return a list of detected problems to the circuit designer. Finally, it would be desirable to know that the design rules being used in the examination are complete and current.

SUMMARY OF THE INVENTION

The foregoing disadvantages are overcome by the present invention, which comprises a verification engine including a complete and current set of rules and annotations pertinent to a given electronic component and circuitry for comparing detailed circuit design data of a specific circuit with those rules and annotations and producing a discrepancy output report as well as a high-lighted visual presentation of problem areas. The verification engine of a manufacturer or supplier of an electronic chip may be a programmed computer interconnected over a network, such as the Internet, to a client or customer's computer. The supplier's computer is designed for both receiving and storing the design data of a customer and returning data for generating written and/or visual reports of any circuit design violations detected along with the latest rules where deemed appropriate.

BRIEF DESCRIPTION OF THE DRAWINGS

For a more complete understanding of the present invention, and its advantages, reference will now be made in the following Detailed Description to the accompanying drawings, in which.

DETAILED DESCRIPTION

Figure 1:
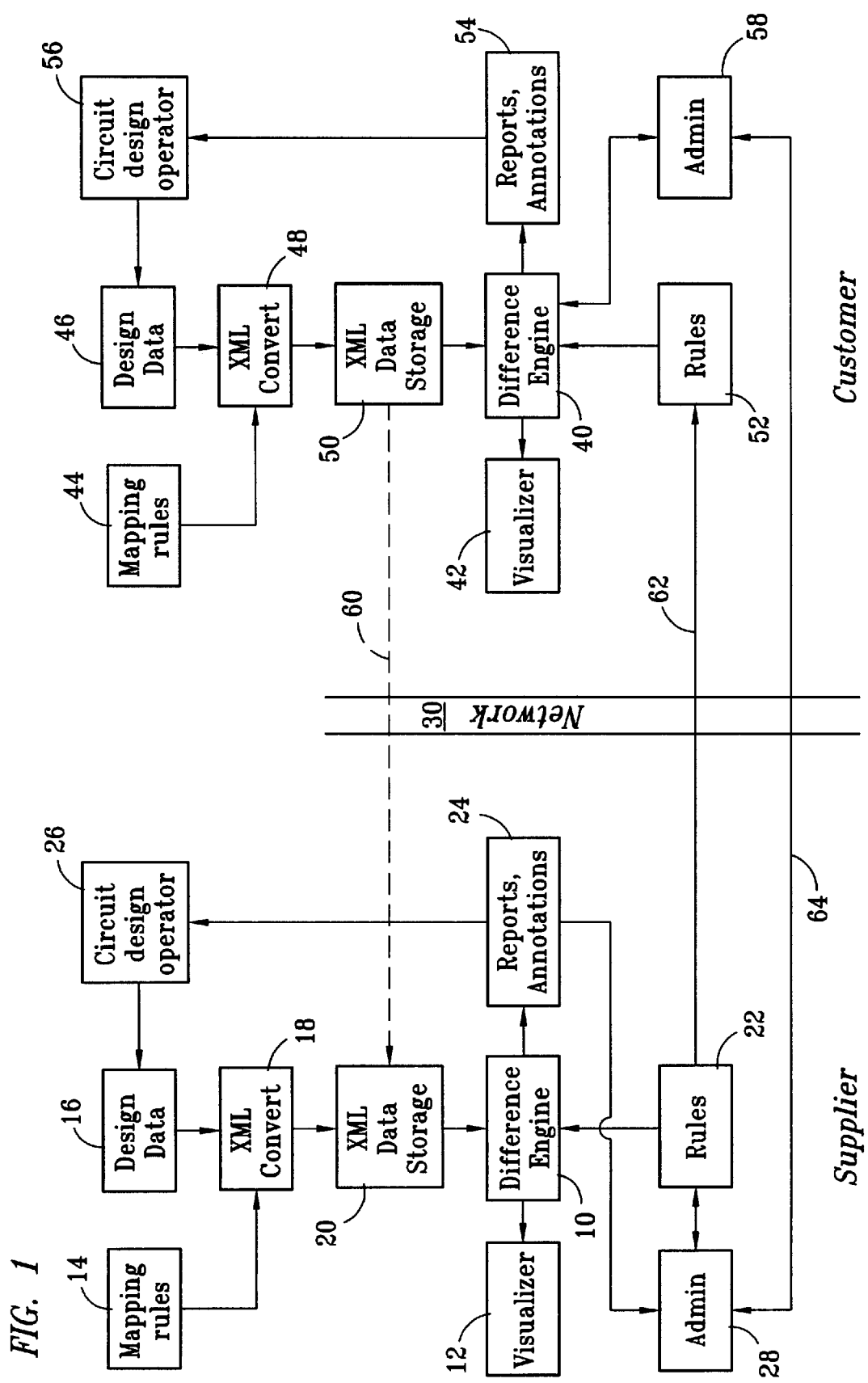
FIG. 1 is a block diagram of the major components utilized by both a chip supplier and a customer in practicing the present invention and provides an indication of data flow in the initial design phase of an electronic circuit including at least one electronic chip.

The rules and restrictions that are developed by a manufacturer of an electronic chip for use by a circuit designer may be broken or divided into "primary" or "verification" rules and "secondary" or "annotation" rules. The primary rules check the consistency and validity of the component information. Among these rules are completeness rules that will check that the component definition contains all the correct declarations of its pin connections. For example, it would be a major violation if the component information had a pin missing (this is one of the typical errors on large pin count components). Other rules ensure that the circuit design of the component defines the correct connections. For example, it would also be a major problem if the design data related to a given pin number does not match the logical functions of that pin. Such an error in design data has been found to be typical, especially on components or chips, with a large number of pins or terminals. The secondary rules check the context in which a component is used, assuming that the component is valid and consistent with the manufacturer's definitions. These secondary rules will mainly check electrical connectivity of the component pins. For example, the manufacturer could declare that a particular pin needs to be connected to voltage value range, such as VCC, or that a particular pin requires a pulldown resistor having a given resistance value range.

The primary rules are first order rules, similar to syntactical checks of compiled computer languages. The secondary rules are second order rules, similar to semantic checks of computer languages. For proper application of the rules, there is a sequence of execution required, where the second order rules can only run after the first order rules are successfully run.

Another term used in this document, relative the present invention, is "mapping rules." As used herein, mapping rules are applied to the CAD design data during the conversion to XML. The purpose of mapping rules is to assist the filtering of the design data, by removing superfluous things, and give hints about how to interpret certain design constructs. They are mainly used to "weed out" (remove) constructs and data that pertains only to the specific integration of the CAD (Computer Aided Design) toolset. For example, an integration of two applications in a CAD environment may require the use of additional properties to facilitate this, however, they are not required (and are undesired) in communicating the design data to a difference engine of this invention.

Typically, the manufacturer of a chip will design several test circuits to test the completeness and accuracy of the rules developed. If flaws in the rules are discovered at this stage, the set of rules is appropriately modified. As part of the debugging process, certain customers may also be allowed samples of the chip and a copy of the rules for use in designing circuits that a customer may want to use. Data relating to any flaws in the rules or in resulting circuit design is returned to the manufacturer so that the rules may be appropriately modified or corrected.

Sometimes the manufacturer may discover errors in the chip design that, when corrected, require modifications to the rules associated with a given electronic chip.

Figure 4:
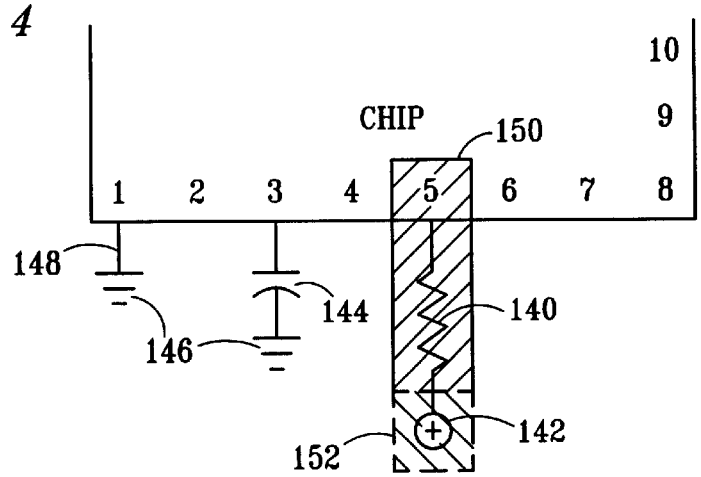
FIG. 4 illustrates a logical (blue print type) red-lined presentation of rule discrepancies.
Figure 5:
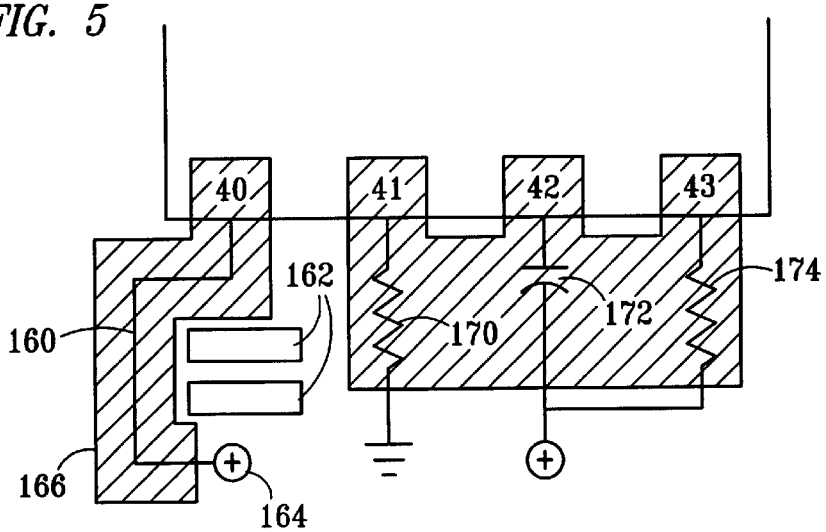
FIG. 5 illustrates a physical (printed circuit board layout type) presentation of rule discrepancies.

In FIG. 1, a difference engine 10 is shown providing outputs to a visualizer 12. A box 14 represents mapping rule data used as described above. Mapping rules are likely to be different for each customer of integrated circuit chip suppliers, as may be apparent from the explanation, supra. A further box 16 represents design data for a particular circuit incorporating a given chip. The data from both blocks 14 and 16 are supplied to an XML converter block 18. The term XML relates to a network language format that is governed by the World Wide Web Consortium (W3C) and more information can be found at http://www.w3c.org. XML was chosen as a standardized language for use by the difference engine 10 to overcome the problem that the design data for a circuit may be set forth in many different formats, depending upon the circuit design software chosen and used by an individual circuit designer. However, any other convenient standardized language could be accommodated by the difference engine 10. The XML formatted data output is then supplied to an XML data storage block 20 for retention until use. The difference engine 10 retrieves data from the memory or the hard disk storage area represented by block 20 as needed in a checking process. The difference engine 10 is essentially a computer including data storage, memory and programs for comparing the design rules as set forth in a block 22 with the actual circuit design being checked and outputting a rule violation report and a set of annotations to a block 24 as well as to the visualizer 12. The rules violation data contained in block 24 may then be used by a circuit designer (represented by a block 26) to alter or correct the circuit design, thereby changing the data in block 16. The annotations referred to in block 24 comprise data that may be used by a visualizer device to red-line circuit related material. This red-lined (also referred to as "high-lighted") material may be either in the form of logical or physical diagrams or both in accordance with a circuit designer's requirements. A logical diagram is represented in FIG. 4, while a physical diagram (printed circuit board style layout) is illustrated in FIG. 5.

From the above, it will be apparent that the visualizer 12 may be any device that can graphically inform an observer of rule deviations through red-lining techniques. Examples of block 12 include printers and display monitors. The circuit designer of block 26 will have access to the visualizer 12 as an aid to finding violations and/or interpreting the report and annotations output of block 24. While the term red-lining typically uses the color red to visually distinguish erroneous material from correct or non-erroneous material in black, other colors and visual effects are to be included within the scope of this invention. The red-lining or erroneous material may take the form of dashed lines, bold lines, cross-hatched lines, and so forth.

An administrator for a chip supplier, as represented by a block 28, may notify a similar difference engine administrator of a customer of rule changes, through a network labeled 30, so that the customer may update his rule database. The administrator 28 also has access to data from the reports and annotations block whereby this information may be forwarded to a customer administrator when debugging customer designed circuits, as will be described in connection with FIG. 2.

The blocks in FIG. 1 to the left of the network 30 are shown to be part of a manufacturer or supplier operation or, alternatively, any third party debugger having access to the latest rules regarding components incorporated in a given CAD design. A substantially identical configuration of components, software and individuals would be in existence at a customer's operational base. Thus, as shown on the right side of FIG. 1, there is a difference engine 40, mapping rules and design data blocks 44 and 46 supplying data to an XML converter block 48 and XML data storage represented by a block 50. The stored XML data, represented by block 50, is retrieved by difference engine 40 as needed when checking the customer's circuit design. The output of the difference engine is supplied to the visualizer 42 as well as to a reports and annotations block 54 for use by a circuit design operator 56 in creating a circuit, as represented by the design data block 46. An administrator block 58 illustrates a communication path between supplier and customer for providing updates of rules. This path is also used in the debugging process, as set forth in FIG. 2, to request debugging by the supplier and the transfer of resulting reports and annotations from the supplier to the customer. A dash line communication link 60 is shown whereby the customer's design data in XML format may be transferred to the supplier for debugging. A further path 62 is illustrated for updating the rules database of the customer and finally a communication path 64 is shown connecting the administrator blocks 28 and 58. While typically paths 60, 62 and 64 may be the same physical connection, the three are separated for clarity of explanation of operation.

Figure 2:
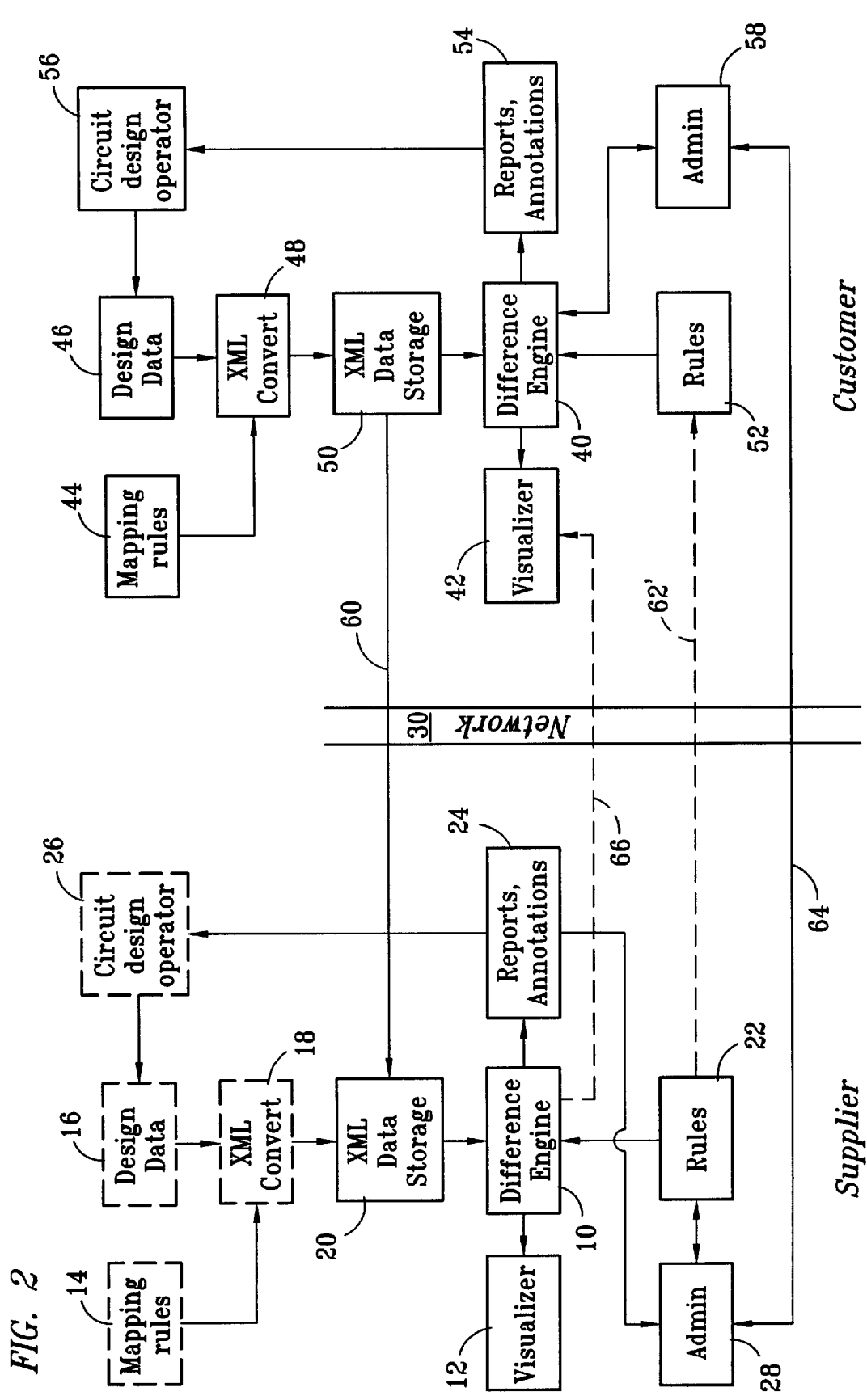
FIG. 2 is a block diagram of the major components utilized by both a chip supplier and a customer in practicing the present invention and provides an indication of data flow in the debug phase of an electronic circuit design including at least one electronic chip.

FIG. 2 shows all the same blocks as shown in FIG. 1 and these blocks have the same number designations. The communication path from block 50 to block 20 is shown solid and numbered 60'. The path from rules block 22 to rules block 52 is shown as a dash line path 62' and a dash line path 66 is added for possible direct communication from the difference engine 10 to the customer's visualizer. Further, blocks 14, 16, 18, and 26 are shown in dash line format, as they are not utilized when a customer's design is being debugged.

In operation, the rules of block 22 are developed by the supplier or chip manufacturer, as set forth above in connection with FIG. 1. When a customer designs a circuit using a supplier's chip, the rules developed by the supplier are used by the customer to design a circuit, the data for which is represented by block 46. The difference engine is used to detect deviations from the rules of block 52. This information presented by the visualizer 42 and the reports of block 54 are reviewed by the circuit designer represented by block 56 to correct any deviations from the rules detected by the difference engine 40. The circuit is then constructed and tested. If the circuit fails to operate as intended, the design data may be passed to the supplier over path 60' for debugging, as shown in FIG. 2.

One possible scenario is that the customer circuit designer has been operating from an outdated set of rules with regard to the circuit design of the chip in question. If so, the administrator of block 28 may cause a new set of rules to be supplied to the customer over path 62'. Such action may be used in conjunction with advising the customer over path 64 or some other means in accordance with previously established procedures between the two entities. Data from block 24 may also be provided to the customer. In some instances, data may be passed from the supplier to the visualizer 42 of the customer via path 66.

Another scenario is that the design utilized by a customer exposed, to the supplier, an unintended failing of the chip and further rules need to be developed and forwarded to the customer. In some instances, the chip may need to be redesigned to correct the problem uncovered by the customer. The customer would then need to be advised to await the new chip design or maybe temporarily continue to utilize a prior circuit design.

Figure 3A:
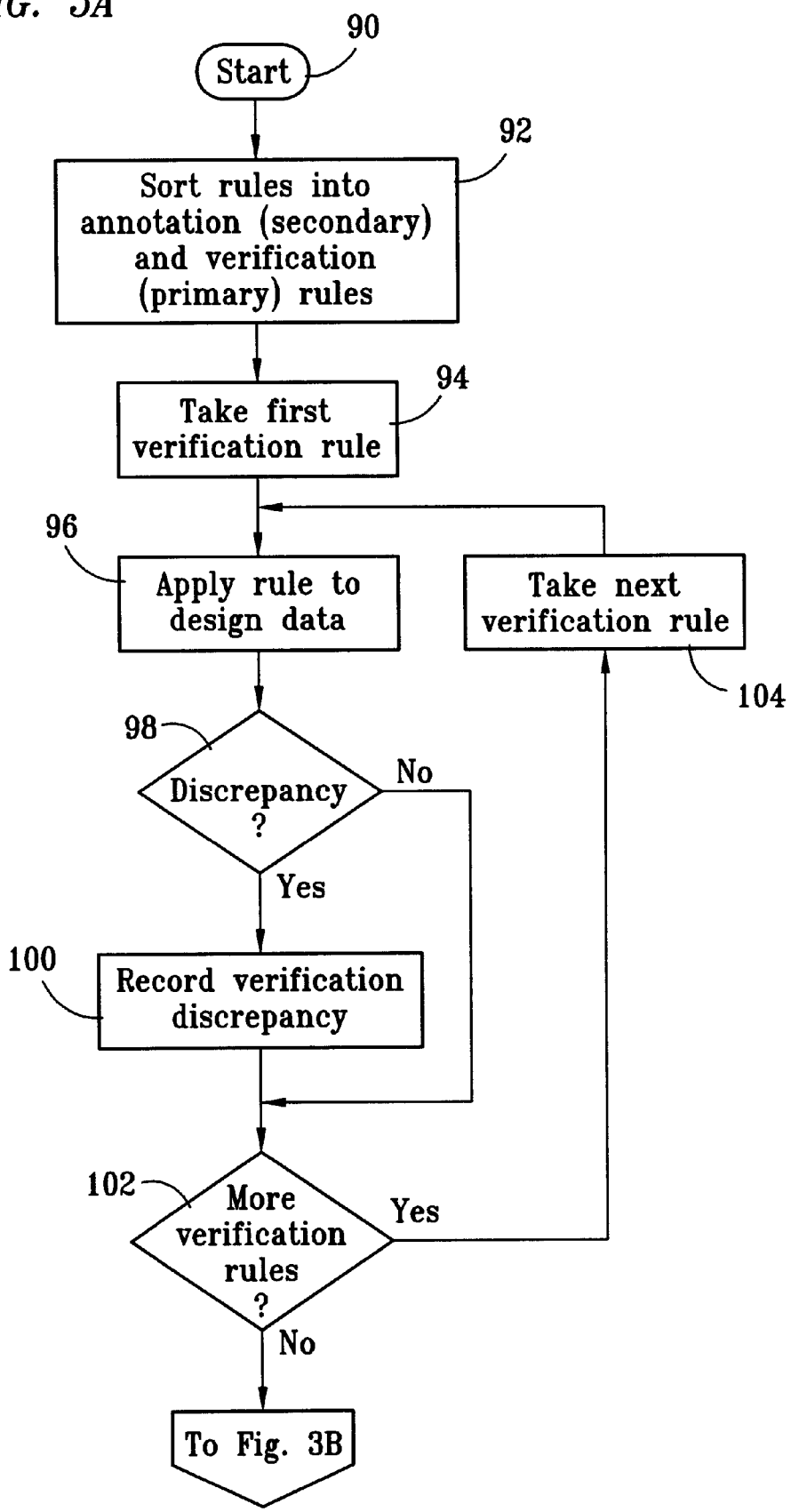
FIGS. 3A and 3B comprise a flow diagram of the operation involved in checking the design of a flow diagram using the components of FIG. 1 or 2.
Figure 3B:
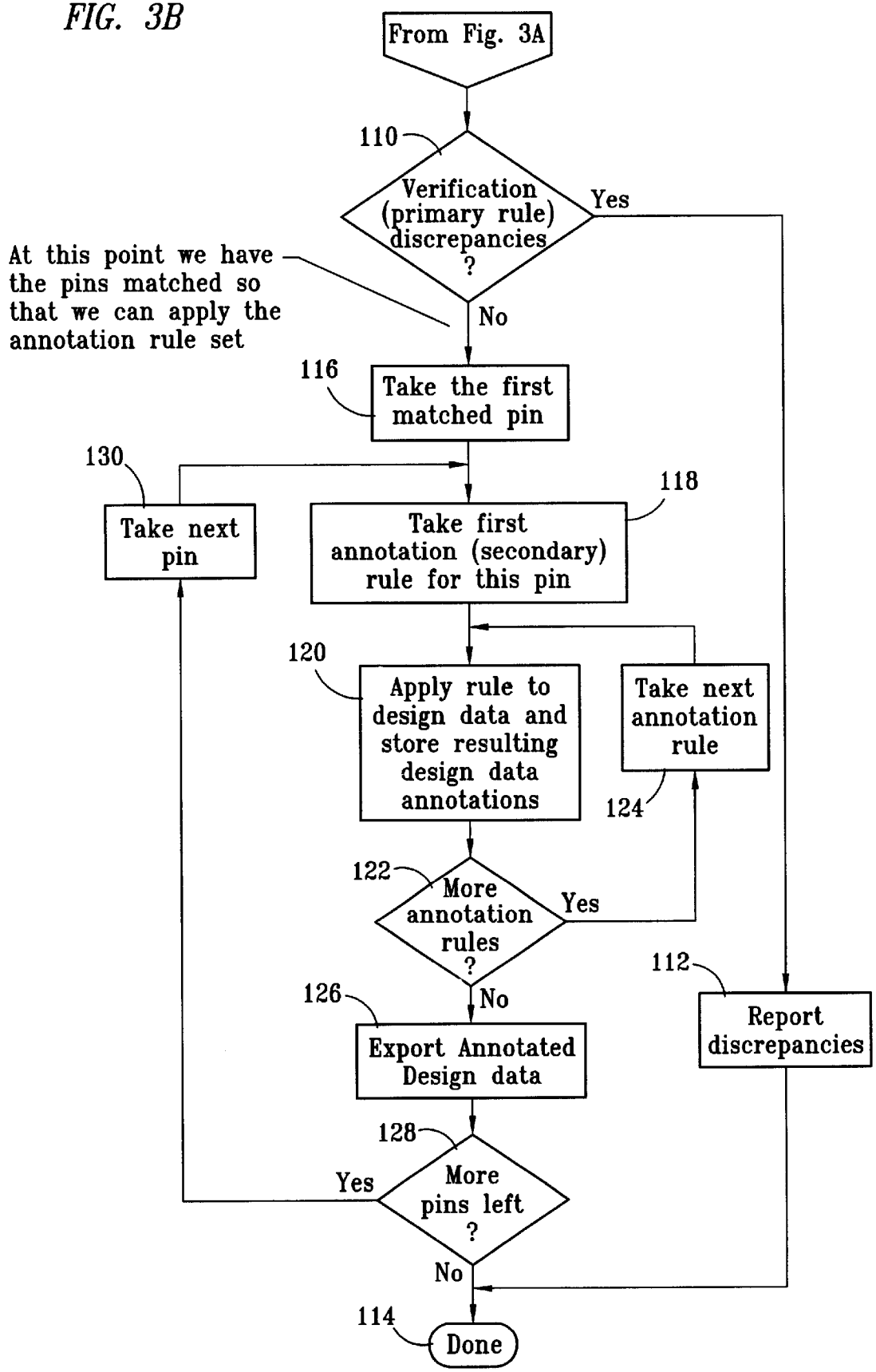

The difference engines 10 and 40 both operate in an identical manner along the lines presented in FIGS. 3A and 3B. The process comprises the difference engine taking rules and design data and creating annotations for the design data. The annotations are then used to create high-lights in the design data for display on a visualizer. The annotations of blocks 24 and 54 are a result of running the difference engine against a set of rules, such as set forth in blocks 22 or 52. The circuit design operator of blocks 26, 56, or other appropriate user, can review these annotations in a report or in highlighted form from or on the visualizer.

The process used by the difference engines commences with a start block 90 and proceeds to a sort rules block 92. In accordance with block 92, the rules obtained from rules blocks 22 or 52 are sorted into primary (or verification) rules and secondary (or annotation) rules. The rest of FIG. 3A deals only with primary rules. A first rule in the sorted list is picked in a block 94 and the rule is applied to design data, in accordance with a block 96, as originally obtained from design data block 16 or 46 and stored in XML format in block 20 or 40. If, in applying the rule to the design data, a discrepancy is detected, as set forth in a block 98, this primary or verification discrepancy is recorded in accordance with a block 100 before checking to ascertain if there are any more primary rules in the sorted list not yet applied to the design data, as set forth in a decision block 102. If, on the other hand, no discrepancy is found in decision block 98, the process skips the recordation block 100 and proceeds directly from block 98 to block 102. If, in block 102, it is determined that there are more non-applied rules, the next primary rule is selected from the list, as stated in a block 104, before applying same in block 96. This selection process continues through the entire list of primary rules. When the last one has been applied, the decision block 102 causes the process to proceed to a decision block 110 in FIG. 3B. If any primary discrepancies have been detected, there is no reason to check for secondary discrepancies. Therefore, a YES determination in block 110 results in the discrepancies being reported, as set forth in a block 112, before completing the process at a DONE block 114.

When no primary discrepancies are detected by block 110, the first matched pin is selected in a block 116. As noted in the figure, at this point, the pins are all matched to associated annotation rules for ease of program application. Thus, in a further block 118, the first annotation or secondary rule, applicable to the first matched pin, is selected from the sorted list compiled by block 92. This annotation or secondary rule is applied, in a block 120, to the design data as stored in XML format, and any appropriate annotation data is generated and stored for eventual use in an output record to be used in written form directly and/or visually as high-lighted in the visualizers 12 and 42. If more annotation rules, applicable to the pin last selected, are detected in a decision block 122, that have not been applied to the circuit under consideration, the next rule in the list is selected in a block 124 before returning to the application and recording block 120. When the last annotation rule, for a given pin, has been applied, as determined in decision block 122, a block 126 causes an export of the annotated design data deficiencies as stored in accordance with block 120. These deficiencies are sent to blocks 24 or 54 as appropriate before proceeding to a decision block 128 to ascertain if there are any more pins in the list having matched secondary annotations. If so, the next pin is selected, in accordance with a block 130, before returning to selection block 118. If, on the other hand, a determination is made in block 128 that there are no pins remaining, the process of completing the verification task occurs in the DONE block 114.

While the program does not report annotation (secondary) discrepancies if there are verification (primary) discrepancies, both are shown in connection with FIGS. 4 and 5 to reduce the number of drawings and simplify the disclosure. It should further be noted that FIG. 4 is only a partial showing of a logical circuit diagram showing a portion of an electronic chip with only three pins having illustrated connection. In this figure, a plurality of components necessary to implement a practical circuit incorporating an electronic chip are illustrated for explanatory purposes. As shown, a resistor 140 is connected between pin #5 and a positive power terminal 142. A capacitor 144 is connected between a pin #3 and a ground connection 146, while a pin #1 is connected directly to ground 146 by a lead 148. The pin #5 and the resistor 140 are enclosed in a cross-hatched box labeled 150. A further dash line cross-hatched box 152 encloses terminal 142. The cross-hatched boxes 150 and 152 represent red-lining.

If the resistor 140 was red-lined as a discrepancy of the verification rules, it might be for a rule that pin #5 is to be left unconnected or alternatively connected directly to ground. In either situation, both of the areas 150 and 152 would be emphasized. If, however, the positive terminal were proper and a capacitor rather than a resistor 140 was to be connected to pin #5, the red-lining may well include only the area 150. If the resistor 140 was red-lined in connection with a secondary rule, it might be, as an example of reasons, because the resistance value was outside a given range of acceptable values or because the composition was such that temperature variations of the environment to which the resistor is likely to be subjected would cause resistance variations operationally unacceptable to the electronic chip.

The pins #3 and #1 have no cross-hatched high-lighting shown. Therefore, it may be assumed that no rule violation was detected.

In FIG. 5, and in connection with a pin #40, a lead 160 is shown as being routed around components or other objects 162 in the connection from pin #40 to a positive terminal 164. It may be assumed that the direct connection from pin #40 to positive terminal 164 was correct. However an annotation or secondary rule may indicate that the length of the connection path for a given width of lead introduces more than a given amount of resistance to current flow. In such a situation, the violation could be solved by increasing the width of the path or finding a shorter path connection.

In the remaining part of FIG. 5, pins #41, #42 and #43 are all shown high-lighted. As shown, a resistor 170 connects pin #41 to ground, while a capacitor 172 connects pin #42 to a positive terminal, and a resistor 174 connects pin #43 to a positive terminal. It may be assumed that each of these component connections complies with the supplier's rules. These components are shown in high-lighted format because the design data indicates that the components are physically too close together. It may have been found that a capacitor such as 172 varies in capacity by too wide a range from the heat of closely adjacent resistors, such as 170 and 174. This type of rule may be pin specific or may apply to all components connected between chip pins and other terminals in the circuit design.

Although not specifically detailed in the figures presented herein, an example of another type of rule may relate to enforcing a certain propagation delay and rise/fall time of signals applied to or leaving an electronic chip. Again, such a rule may be pin specific or applicable to all appropriate signal leads of the chip. Further, such a rule would apply to multiple types and combinations of components and even their proximity to other signal carrying components.

The most common present day use of the above-described invention will be with electronic chips. However, the discrepancy detection by the difference engine may include any electronic component, set of components or circuit component configurations in the circuit design for which a set of computer readable rules can be compiled as implied by some of the examples outlined above. Further, the present invention applies to any components of any CAD design program for which the component's rules of use may have been generated including, but not limited to, components used in architectural design.

Figure 6:
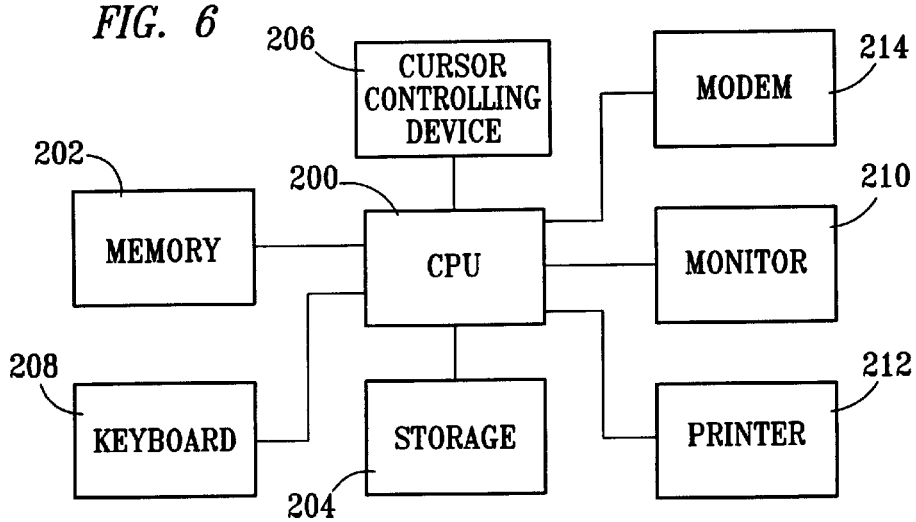
FIG. 6 presents a block diagram of computer components for performing the functions shown at each of the supplier and customer's sites in FIGS. 1 and 2.

In FIG. 6, a CPU 200 is illustrated having internal or external memory 202 and data storage 204. Storage apparatus 204 may comprise both internal and removable storage means. Such removable storage may be used to install programs and to transfer output or destination data files generated as a result of using this invention to other devices. The CPU 200 is further connected to a cursor controlling device 206, such as a mouse, trackball and so forth. The CPU 200 is further connected to a keyboard 208, a monitor or visualizer 210 and a printer or visualizer 212 for entering commands, viewing file contents and program results and printing output, respectively. A modem 214 allows communication to other computers over a network.

Although the invention has been described with reference to a specific embodiment, these descriptions are not meant to be construed in a limiting sense. Various modifications of the disclosed embodiment, as well as alternative embodiments of the invention, will become apparent to persons skilled in the art upon reference to the description of the invention. It is therefore contemplated that the claims will cover any such modifications or embodiments that fall within the true scope and spirit of the invention.

What is claimed is:

1. A method of verifying the correctness of external circuit connections to an electronic chip, comprising the steps of:

generating a set of component circuit design data relative electronic components in a specific circuit configuration;

compiling a set of rules for said electronic components;

comparing the circuit design data for said electronic components with respect to said rules; and generating a discrepancy report.

2. The method of claim 1, wherein:

the components are electronic chips;

the circuit design data relates to electronic chip pins and the required connections and non-connections to said pins; and a visually high-lighted display of discrepancies is generated.

3. A method of verifying the correctness of external circuit connections to an electronic chip, comprising the steps of:

interconnecting a verification computer, including a set of pin connection rules for at least one of a plurality of electronic chips, with a second computer having a CAD (computer aided design) program generated circuit design detailing an electronic circuit including said a least one electronic chip;

comparing the pin connection data for each pin with respect to said rules; and generating a discrepancy report.

4. The method of claim 3, comprising the additional step of generating data for use in creating a high-lighted visual display of circuit design discrepancies.

5. The method of claim 3, comprising the additional step of generating a high-lighted visual display of circuit design discrepancies relative said rules.

6. The method of claim 3, comprising the additional steps of:

making the interconnection over a network;

converting the CAD generated data into an XML format for transmission over the network from said second computer to said verification computer;

assembling the received XML formatted design in a database;

supplying both a red-lined schematic and an item list of discrepancies; and returning the report to said second computer over the network.

7. The method of claim 3, comprising the additional steps of:

converting the CAD generated data, of said second computer, into an XML format before examination by said verification computer;

assembling the received XML formatted design in a database;

supplying a report comprising both a red-lined schematic and an item list of discrepancies; and returning the report to said second computer.

8. A method of expediting the detection of circuit design deficiencies of an electronic chip customer by a remote party, comprising the steps of:

sending circuit design data in a standardized format from a customer to the remote party;

examining said circuit design by checking the connections or lack thereof to each pin of an electronic chip incorporated in the circuit design against a set of rules generated by the supplier of said chip; and returning circuit design discrepancy data from said remote party to said customer.

9. The method of claim 8, wherein:

the remote party is the supplier of said electronic chip; and the discrepancy data includes visually high-lighted data for display in conjunction with a visualizer at the customer's premises.

10. The method of claim 8, comprising the additional steps of:

sorting electronic chip supplier generated rules into primary and secondary rules;

checking the received circuit design data against the primary rules; and returning a discrepancy data report to said customer, without checking secondary rule discrepancies, when any primary rule discrepancies are detected.

11. The method of claim 8, comprising the additional steps of:

sorting electronic chip supplier generated rules into primary and secondary rules;

checking the received circuit design data against the primary rules;

checking the received circuit design data against the secondary rules; and returning a discrepancy data report, including a high-lighted visual discrepancy presentation, to said customer when rule discrepancies are detected.

12. Apparatus for detecting electronic component circuit design rule violations in CAD (computer aided design) circuit designs, comprising:

means for storing rules relating to circuit design for given electronic components;

means for storing design data relative a given circuit including said given electronic components; and difference engine means for comparing said design data and said rules and generating discrepancy data when violations of said rules are detected.

13. Apparatus as claimed in claim 12, wherein said components include electronic chips whereby the stored rules include pin connection rules for given electronic chips.

14. Apparatus as claimed in claim 12, comprising, in addition:

sorting means for separating said rules into primary and secondary rules; and means for reducing difference engine comparison time by eliminating secondary rule comparisons when primary rule discrepancies are detected.

15. Apparatus as claimed in claim 12, comprising, in addition:

means for receiving said stored design data from said CAD circuit design over a network from a remote source; and means for returning said discrepancy data over said network to said remote source for at least one of visual and written presentation to a circuit designer at said remote source.

16. A method of ascertaining electronic chip pin connection rule violations in CAD (computer aided design) circuit designs, comprising the steps of:

comparing data derived from said CAD circuit design and pin connection rules applicable to an electronic chip incorporated in said CAD circuit design; and generating discrepancy data when violations of said rules are detected.

17. The method of claim 16, wherein the discrepancy data is used to generate a visual presentation of detected discrepancies.

18. The method of claim 16, comprising the additional steps of:

receiving said data derived from said CAD circuit design over a network from a remote source; and returning said discrepancy data to said remote source for at least one of high-lighted visual and item list presentation to a circuit designer at said remote source.

19. Apparatus for expediting the detection of circuit design deficiencies of an electronic chip user by a remote party, comprising:

CAD (computer aided design) circuit means, at a chip user site, for generating circuit design data;

means for sending said circuit design data in a standardized format from said chip user site, over a network, to a remote party site for detecting design deficiencies;

computer means for receiving and examining said circuit design data, at said remote site, by checking the detailed connection design data relative each pin of an electronic chip incorporated in the circuit design against a computer accessible set of rules generated by a manufacturer of said chip;

means for returning circuit design discrepancy data from said remote party site, over said network, to said chip user site; and means, at said chip user site, for presenting the discrepancy data to an operator of said CAD circuit means in a user friendly format.

20. Apparatus as claimed in claim 19 where said means for presenting the discrepancy data includes display means for visually displaying said circuit design discrepancy data in high-lighted format.

21. A method of verifying the correctness of component design usage, comprising the steps of:

generating a set of computer readable design data relative components in a specific design configuration;

compiling a set of rules for usage of said design components;

comparing the circuit design data for said design components with respect to said rules; and generating a discrepancy report.

22. Apparatus for detecting component design rule violations in CAD (computer aided design) designed apparatus, comprising:

means for storing rules relating to components included in an apparatus design for given design components;

means for storing design data relative a given CAD design including said given design components; and difference engine means for comparing said design data and said rules and generating discrepancy data when violations of said rules are detected.

* * * * *